United States Patent
Brown et al.

(10) Patent No.: US 7,565,272 B2
(45) Date of Patent: Jul. 21, 2009

(54) SYSTEM AND METHODS FOR INTEGRATING AUTHORING WITH COMPLEXITY ANALYSIS FOR COMPUTING SYSTEM OPERATION PROCEDURES

(75) Inventors: Aaron B. Brown, Croton-on-Hudson, NY (US); Joseph Y. Kim, Sunnyvale, CA (US)

(73) Assignee: International Business Machines Corporation, Armonk, NY (US)

( * ) Notice: Subject to any disclaimer, the term of this patent is extended or adjusted under 35 U.S.C. 154(b) by 80 days.

(21) Appl. No.: 11/301,813

(22) Filed: Dec. 13, 2005

(65) Prior Publication Data

US 2007/0136016 A1   Jun. 14, 2007

(51) Int. Cl.
 G06F 17/24 (2006.01)
 G06F 19/00 (2006.01)
(52) U.S. Cl. ............ 702/186; 702/123; 702/183; 717/110
(58) Field of Classification Search .......... 702/186
 See application file for complete search history.

(56) References Cited

U.S. PATENT DOCUMENTS

| | | | |
|---|---|---|---|
| 5,907,488 A | 5/1999 | Arimoto et al. | |
| 6,467,080 B1 | 10/2002 | Devine et al. | |
| 6,651,244 B1 | 11/2003 | Smith et al. | |
| 6,681,230 B1 * | 1/2004 | Blott et al. | 707/104.1 |
| 6,715,130 B1 | 3/2004 | Eiche et al. | |
| 6,922,684 B1 | 7/2005 | Aldridge et al. | |
| 7,177,774 B1 * | 2/2007 | Brown et al. | 702/81 |
| 2004/0186817 A1 | 9/2004 | Thames et al. | |
| 2004/0236805 A1 * | 11/2004 | Gordon | 707/205 |

OTHER PUBLICATIONS

Brown et al., "A Model of Configuration Complexity and its Application to a Change Management System", IFIP/IEEE International Conference on Integrated Network Management, May 15-19 2005, pp. 631-644.*
Anne Schroeder, "Integrated Program Measurement and Documentation Tools" IEEE, pp. 304-313, 1984.
A.B. Brown et al., "Experience with Evaluating Human-Assisted Recovery Processes," Proceedings of the International Conference on Dependable Systems and Networks, IEEE, 2004, 6 pages, Los Alamitos, CA.
Office Action for U.S. Appl. No. 11/495,336, citing U.S. Patent No. 6,715,130 and U.S. Patent No. 6,651,244.

* cited by examiner

*Primary Examiner*—Hal D Wachsman
(74) *Attorney, Agent, or Firm*—Farrokh Pourmirzaie; Ryan, Mason & Lewis, LLP

(57) ABSTRACT

Techniques are disclosed for integrating complexity analysis with procedure authoring (design and/or documentation). By way of example, a technique for authoring a procedure associated with a computing system operation based on a complexity analysis associated with the operation and the computing system implementing the operation comprises the following steps/operations. A procedure associated with a computing system operation is generated, wherein the generated procedure represents a new procedure or an edited existing procedure. A structured representation of the generated procedure is extracted from the generated procedure. The structured representation of the generated procedure is analyzed to produce complexity analysis results, wherein at least a portion of the complexity analysis results are fed back to a procedure author for use in selectively altering the generated procedure. The technique may also further comprise generating documentation relating to the generated procedure from the structured representation of the generated procedure.

8 Claims, 6 Drawing Sheets

SYSTEM AND METHODS FOR INTEGRATING AUTHORING WITH COMPLEXITY ANALYSIS FOR COMPUTING SYSTEM OPERATION PROCEDURES

CROSS REFERENCE TO RELATED APPLICATION

The present application is related to the U.S. patent application identified by Ser. No. 11/205,972, filed on Aug. 17, 2005, and issued as U.S. Patent No. 7,177,774 on Feb. 13, 2007, entitled "System and Methods for Quantitatively Evaluating Complexity of Computing System Configuration."

FIELD OF THE INVENTION

The present invention relates to computing systems and, more particularly, to techniques for integrating operation procedure authoring in such computing systems with quantitatively evaluation of the complexity of configuring such computing systems.

BACKGROUND OF THE INVENTION

Developers, managers, and operators of computing systems often find it necessary to design and document (collectively, "author") procedures defining how operational tasks should be performed on the computing system. For example, technology consultants and outsourcing organizations often develop, document, and maintain so-called "best-practice" procedures that describe recommended or optimized methods for operations tasks covering installation, configuration, integration, interconnection, maintenance, upgrading, diagnosis, repair, and decommissioning of computing systems and/or their constituent parts. Likewise, software and hardware products are typically accompanied by end-user documentation (e.g., manuals, users guides) describing how their users and administrators should perform various operations tasks like installation, configuration, and executing common usage scenarios. As an additional example, developers attempting to automate manually-performed operations procedures will typically design and document a baseline procedure before developing an automated implementation.

Operations procedures such as those described above often present significant complexity to the people that carry them out or implement them in automation—the procedures are difficult to understand and implement or execute correctly—resulting in errors and demanding an expensive, highly-skilled workforce. This situation results from the fact that, during development of operations procedures, the design, documentation, and complexity analysis of the procedures are carried out independently, with no immediate feedback to the designer as to the ramifications of design choices. Indeed, the complexity analysis step is often omitted entirely, or performed once in the form of a time-consuming and expensive user study, providing little ability for iterative improvement of the procedure.

This situation motivates the need for a system and methods that integrate complexity analysis with procedure authoring (design and/or documentation).

SUMMARY OF THE INVENTION

The present invention provides techniques that integrate complexity analysis with procedure authoring (design and/or documentation).

By way of example, in one aspect of the invention, a technique for authoring a procedure associated with a computing system operation based on a complexity analysis associated with the operation and the computing system implementing the operation comprises the following steps/operations. A procedure associated with a computing system operation is generated, wherein the generated procedure represents a new procedure or an edited existing procedure. A structured representation of the generated procedure is extracted from the generated procedure. The structured representation of the generated procedure is analyzed to produce complexity analysis results, wherein at least a portion of the complexity analysis results are fed back to a procedure author for use in selectively altering the generated procedure (e.g., for use in altering the generated procedure, if the procedure designer so desires). The technique may also further comprise generating documentation relating to the generated procedure from the structured representation of the generated procedure.

The extraction and analysis steps/operations may be repeated when the procedure author alters the generated procedure based on the feedback of the complexity analysis results. The procedure author may use the feedback to alter the generated procedure to minimize complexity or to vary a tradeoff between complexity and flexibility.

Further, the procedure generating step/operation may further comprise one or more of: entering one or more workflow elements to create one or more new elements for the procedure or modifying one or more existing workflow elements; entering one or more documentation elements to create one or more new documentation elements or modifying one or more existing documentation elements; searching a documentation element repository to identify appropriate documentation and linking the documentation to the procedure or one or more elements of the procedure; composing workflow elements together; loading one or more pre-existing procedures; and exporting an internal procedure representation for use by the extraction step.

Still further, the extraction step/operation may further comprise obtaining an internal procedure representation generated by the procedure generation step/operation. The extraction step/operation may further comprise one or more of: extracting one or more workflow elements from the internal procedure representation; extracting a workflow structure from the internal procedure representation; extracting one or more documentation elements from the internal procedure representation; and encoding extracted information into a structured representation of an overall workflow such that a documentation-annotated workflow representation is produced.

The complexity analysis step/operation may further comprise producing one or more complexity metrics and scores.

The documentation generating step/operation may further comprise one or more of: assembling one or more linked or embedded documentation elements into a unified documentation describing the generated procedure; and annotating the documentation with complexity-based meta-information.

Advantageously, by integrating complexity analysis into the authoring process, procedure designers receive dynamic feedback indicating the consequences of design decisions in terms of the complexity of the procedure being authored. This enables the designer to quickly identify and author procedures that minimize complexity, to iteratively refine a procedure to reduce its complexity, and to recognize the complexity implications of design decisions and make explicit judgments concerning tradeoffs between complexity and procedure functionality.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
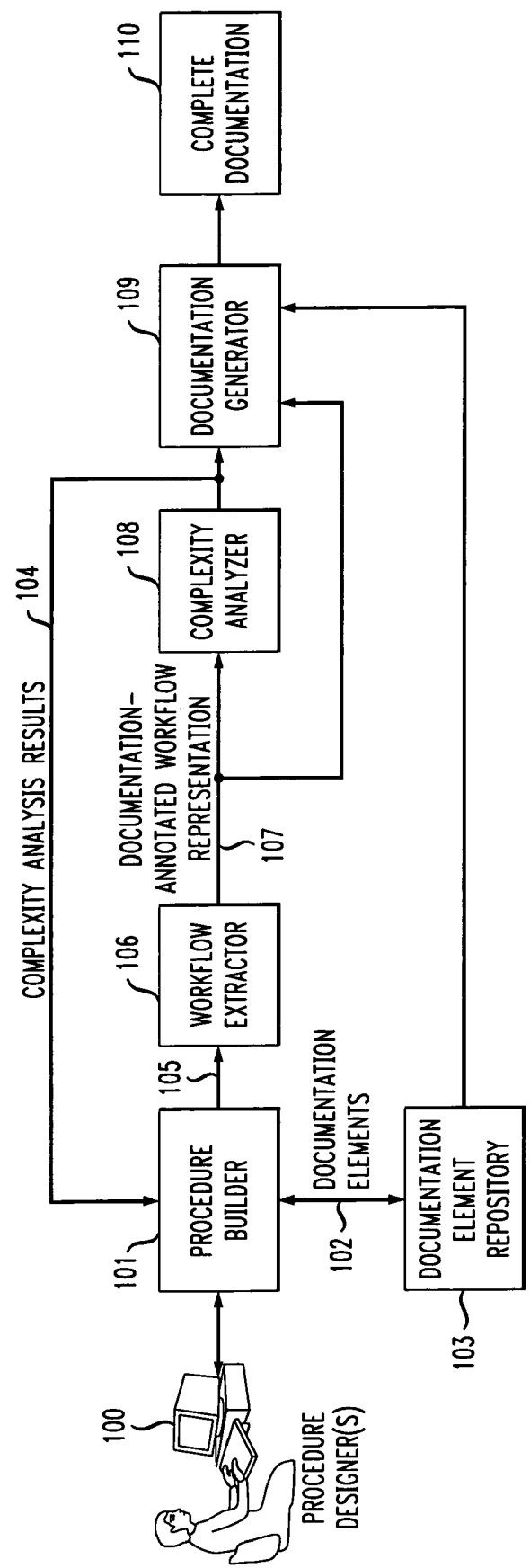
FIG. 1 is a block diagram illustrating a procedure authoring and configuration complexity evaluation system and its associated environment, according to an embodiment of the invention.

As will be illustratively described below, principles of the present invention provide techniques for integrating authoring (design and/or documentation) and incremental complexity analysis of information technology (IT) operations procedures into a single, unified, interactive framework that provides immediate feedback on the complexity implications of design decisions. In the illustrative architecture described herein, a system implementing the techniques includes a procedure builder, a workflow extractor, a complexity analyzer, and, in one embodiment, an optional documentation generator.

In accordance with illustrative principles of the invention, as will be described in detail herein below, a technique for integrating authoring with complexity analysis may include the following steps. A designer or developer defines a new operations procedure (or edits an existing procedure) by describing the procedure in a structured format, possibly including documentation elements. The procedure's workflow (tasks, steps, decision points, control flow constructs, data items, etc.) and any associated documentation elements are incrementally extracted from this structured format, and a unified representation combining the workflow and documentation is constructed. This representation is used as input to a complexity analyzer (which may, by way of example, comprise a complexity analyzer and complexity reporter as described in the U.S. patent application identified by Pat. Ser. No. 11/205,972, filed on Aug. 17, 2005, and issued as U.S. Patent No. 7,177,774 on Feb. 13, 2007, entitled "System and Methods for Quantitatively Evaluating Complexity of Computing System Configuration," the disclosure of which is incorporated by reference herein), the results of which are reported back to the designer to provide feedback on the complexity of the procedure being defined.

The tight feedback loop and use of an analytical complexity calculator provides the designer with immediate feedback on the complexity impact of design decisions in constructing the procedure, allowing the designer to quickly construct the simplest, lowest-complexity procedure possible while concurrently producing accurate documentation of that procedure.

Furthermore, the technique may include a step where the designer, satisfied with the procedure, causes formatted documentation to be generated that assembles the documentation elements into unified documentation describing the entire procedure.

More specifically, in a first step, the procedure designer authors or edits an operations procedure using an interactive environment that allows specification of procedure elements (such as tasks, steps, decision points, control flow constructs, data items, mappings to roles, resources, etc.). The environment may additionally offer capabilities for direct entry of documentation relating to the procedure and its elements, and/or linking of procedure elements to existing documentation elements in a repository of documentation elements. For example, the documentation element for a supplied data item (parameter) might include the name of the parameter, a free-form description, a type constraint, default and/or recommended values, and links to other related workflow elements. The format of procedure entry is of no consequence to the present invention—it may be performed via graphical manipulation, via text entry, via annotation of freeform documentation, or any other method. The environment further provides feedback on the complexity of the procedure and its elements, using data computed by the complexity analyzer, as will be described below. This feedback may be presented in many forms, including as text output, as graphical annotation, as a summary report, as alerts that pop up as the procedure is modified, etc.

In a second step, the procedure defined in the first step is converted from whatever representation was used to define it to a structured representation suitable for complexity analysis. This structured representation can take many forms, such as an Extensible Markup Language (XML) encoded text file, a variant of a Web Services for Business Process Execution Language (WS-BPEL) workflow, etc., but should record the procedure elements as well as any linked or embedded documentation elements. This step will typically run in parallel with the first step, with the conversion happening continuously as the procedure is defined and edited, but it may instead or in addition be run as a separate step after the procedure's design has been finalized.

In a third step, the structured representation of the procedure is analyzed to produce complexity scores and metrics for the overall procedure and/or for individual procedure elements. In one embodiment, the analysis may be performed according to the techniques described in the above-referenced U.S. patent application identified by Ser. No. 11/205, 972 and issued as U.S. Pat. No. 7,177,774 on Feb. 13, 2007, in which case the complexity analyzer and reporter components of such system are used, and where the structured representation of the procedure subsumes the need for a configuration-related data collector. The complexity analysis may also include computation of the overall flexibility of the procedure, i.e., the ability of the procedure to accomplish different goals. Note that as the procedure changes in step 1, steps 2 and 3 can be run concurrently to produce dynamically-updated complexity analysis results as the procedure is authored. These results are then fed back to the environment described in the first step, which uses them to present dynamic complexity feedback to the procedure designer, for example, by annotating procedure elements with color codes determined by their complexity contributions, or by alerting the designer when a particular change causes the procedure to cross a complexity threshold. Using this feedback, the designer can alter the procedure to minimize complexity, or, where flexibility data is present, to vary the tradeoff between complexity and flexibility.

Finally, in a fourth step, the same documentation-annotated workflow representation used to feed the complexity analyzer may be processed to assemble its linked or embedded documentation elements into unified documentation describing the entire procedure. In this step, the workflow structure of the procedure is used to piece together the documentation elements in the procedure representation into complete user-ready documentation in standard formats like HyperText Markup Language (HTML), Portable Document Format (PDF), and/or XML. This document generation can be done on-demand or continuously as the procedure is built, depending on the level of feedback desired by the procedure designer. The documentation generator may also draw on the complexity analysis results to annotate the documentation with complexity-based meta-information, such as the estimated skill level required for each documented task.

Referring initially to FIG. 1, a block diagram illustrates a procedure authoring and configuration complexity evaluation system and its associated environment, according to an embodiment of the invention.

As depicted, procedure designer(s) 100 include one or more human architects, developers, designers, authors, or other human roles involved in the procedure authoring and design process. They interact with procedure builder 101, which provides an authoring interface for creating, viewing, modifying, analyzing, and documenting an IT operations procedure. In its capacity for procedure documentation, the procedure builder may insert, retrieve, or alter documentation elements 102 from documentation element repository 103. Documentation elements represent components of a procedure's overall documentation, such as, but not limited to, a description of a procedure task element or a description of possible criteria for making a decision.

Documentation element repository 103 maintains document elements in an indexed structure. In one embodiment, this repository takes the form of a relational database running on an underlying database server.

Procedure builder 101 additionally consumes complexity analysis results 104 from complexity analyzer 108, and displays those results to procedure designers 100. In one embodiment, the complexity analysis results are displayed as graphical annotations and visual overlays on the on-screen display of the procedure being authored.

As the procedure is being authored, workflow extractor 106 periodically, or at user-defined intervals, extracts the internal representation of a procedure 105 from procedure builder 101 and encodes it into a structured documentation-annotated workflow representation 107, which standardizes the representation, integrates workflow and documentation elements, and is suitable for consumption by other tools such as complexity analyzer 108 and documentation generator 109.

In particular, complexity analyzer 108 periodically or, at user-defined points, consumes documentation-annotated workflow representation 107 and uses it to compute complexity scores and metrics for the procedure described by the documentation-annotated workflow representation. The complexity scores and metrics comprise, collectively, complexity analysis results 104 that are fed back to procedure builder 101 for display as described above, and to documentation generator 109 for use as will be described below.

Documentation generator 109 consumes documentation-annotated workflow representation 107 as well, and uses it, along with documentation elements 102 drawn from documentation element repository 103, to assemble complete user-ready documentation for the corresponding procedure in standard formats. In one embodiment, the documentation generator produces formats including HTML, PDF, and XML. The documentation generator also consumes complexity analysis results 104, and, if so requested by procedure designer(s) 100, uses those results to annotate the documentation with complexity information corresponding to the overall procedure as well as its constituent workflow elements. In one embodiment, documentation generation is done on-demand, when requested by the procedure designer(s), but in other embodiments, it may be performed continuously as the procedure is authored.

Figure 2:
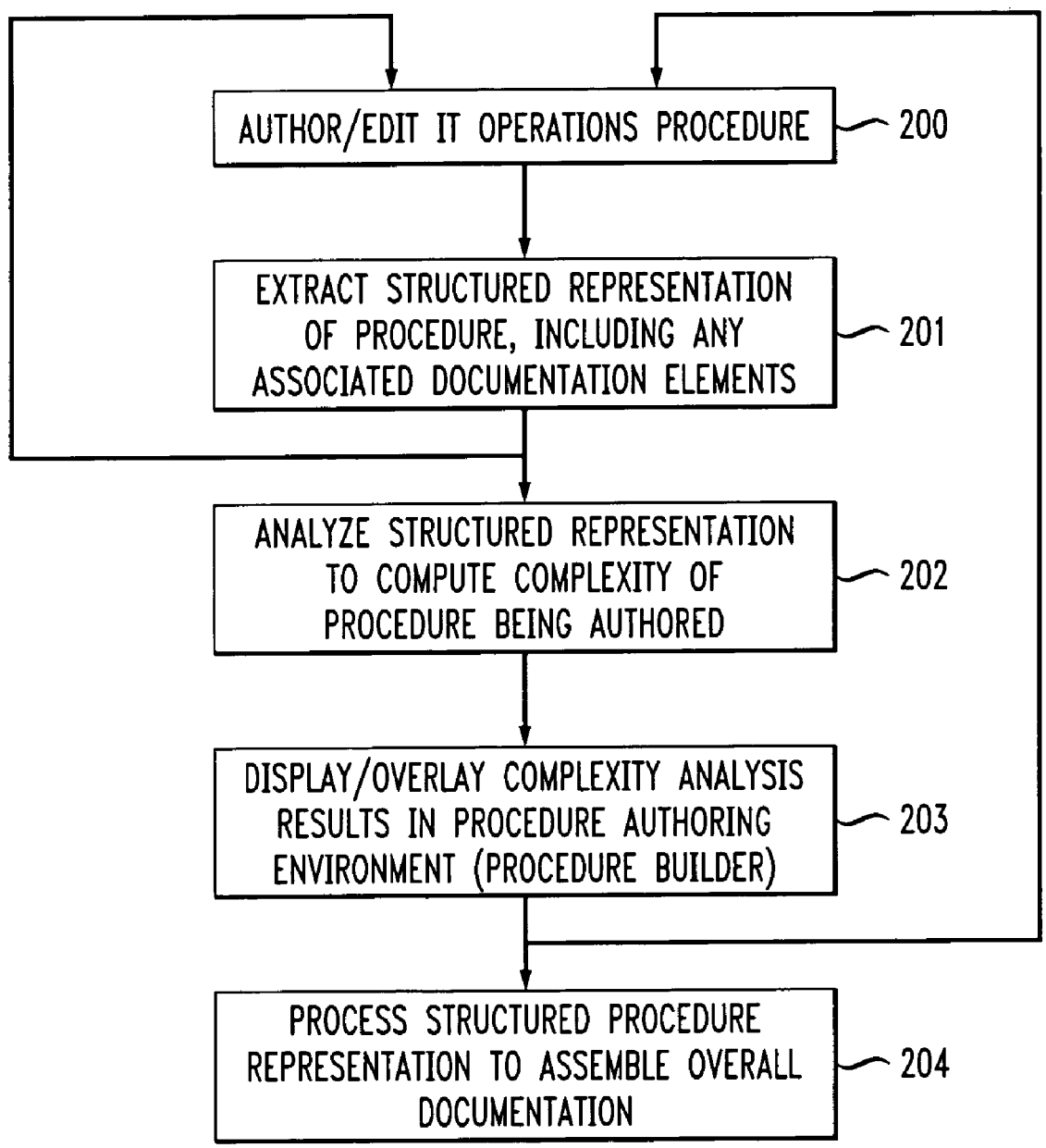
FIG. 2 is a flow diagram illustrating a procedure authoring and configuration complexity evaluation methodology, according to an embodiment of the invention.

Referring now to FIG. 2, a flow diagram illustrates a procedure authoring and configuration complexity evaluation methodology, according to an embodiment of the invention. More particularly, FIG. 2 illustrates a methodology that may be implemented by the system of FIG. 1.

As shown, in step 200, procedure designer(s) 100 author and/or edit one or more IT operations procedures using the interfaces provided by procedure builder 101, as described in detail below and in FIGS. 3 and 4.

In step 201, a structured representation of the procedure(s) is extracted from the authoring/editing tool along with any associated documentation or associations to pre-defined documentation elements. Steps 200 and 201 may be repeated together to provide iterative authoring/editing capability.

In step 202, the structured representation is analyzed to compute the complexity of the corresponding procedure(s).

In step 203, the results of this analysis are then displayed to the procedure designer(s) 100 in the procedure authoring environment. Steps 200 through 203 are repeated as needed until the procedure designer(s) are satisfied with the procedure and its complexity analysis results.

Finally, in step 204, the structured representation may be processed to produce overall procedure documentation incorporating procedure workflow, documentation elements, and complexity analysis results.

Figure 3:
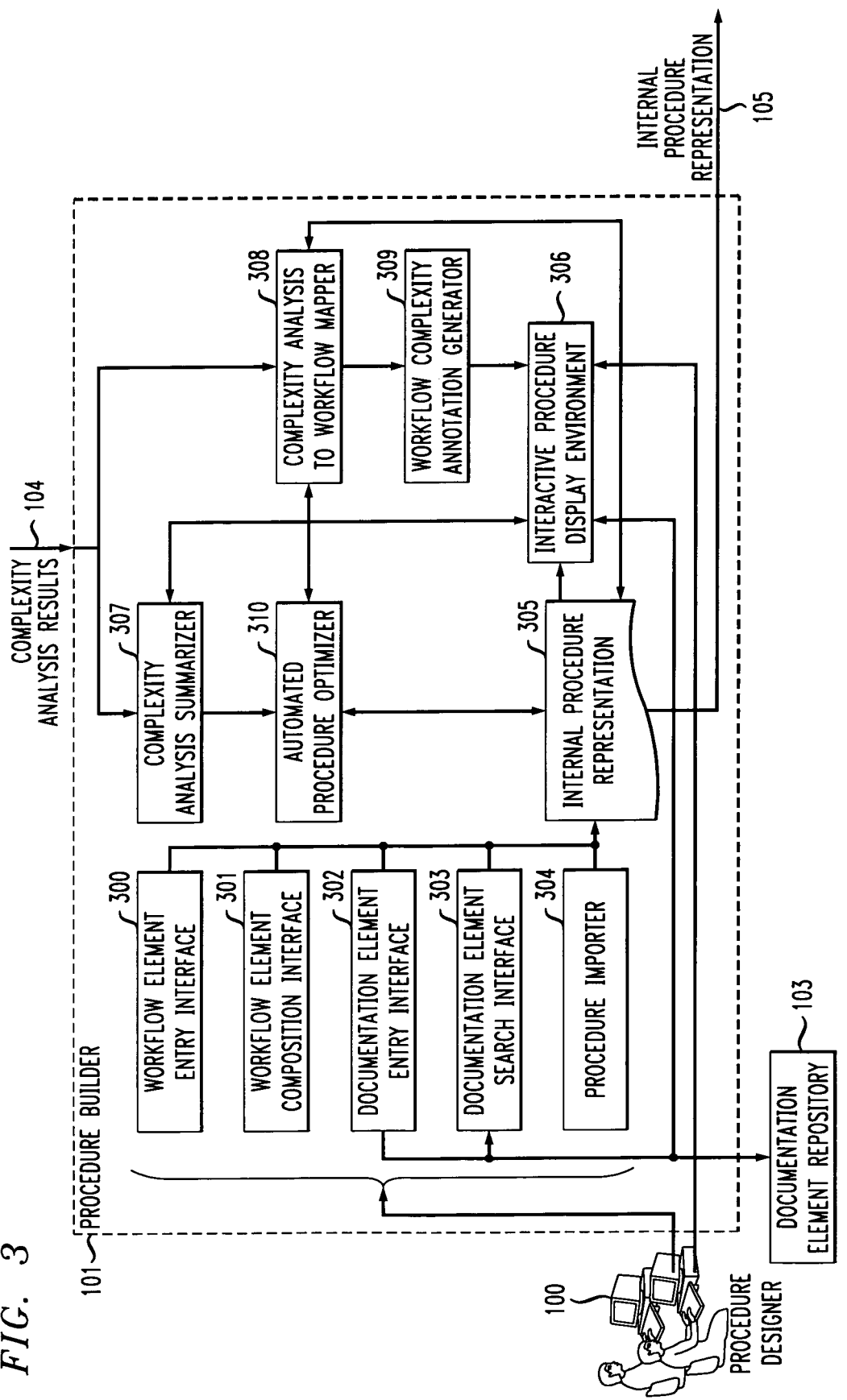
FIG. 3 is a block diagram illustrating a procedure builder component, according to an embodiment of the invention.

Referring now to FIG. 3, a block diagram illustrates a procedure builder component, according to an embodiment of the invention. More particularly, FIG. 3 depicts an example of procedure builder component 101.

As depicted, the first set of components, 300 through 304, provide interfaces for creating or importing elements of an IT operations procedure or associated documentation.

Workflow element entry interface 300 provides a mechanism for defining the workflow elements (tasks, decisions, data items, control flow, roles, resources, etc.) that define the structure of the procedure.

Workflow element composition interface 301 provides a mechanism for composing the defined workflow elements into an overall procedure structure, for example, by connecting tasks to each other via control flow constructs, and associating roles, resources, and data items to the task and flow.

Documentation element entry interface 302 provides a mechanism for entering documentation for any of the workflow elements defined via the interfaces described above, or for the overall procedure. The entered documentation elements are stored in documentation element repository 103 if so-requested by procedure designer(s) 100.

Documentation element search interface 303 provides a mechanism for searching the indexed content in documentation element repository 103 to identify relevant pre-existing documentation elements, and provides a mechanism for linking such identified elements with workflow elements defined using components 300 and 301.

Procedure importer 304 provides a mechanism for importing pre-existing procedures so that they can be edited or so that the pre-existing procedures can be used in parts or in their entirety as building blocks for the procedure being authored. In one embodiment, the procedure importer imports procedures in the same documentation-annotated workflow representation 107 produced by workflow extractor 106, but other embodiments are possible where the procedure importer imports procedures in other formats, such as, but not limited to, WS-BPEL, or processes text-based documentation to automatically extract and import the procedures defined within.

The information entered via components 300 through 304 together comprises an internal procedure representation 305, used to represent and track the current composition and constituent parts of the IT operations procedure within procedure builder 101 during procedure authoring activities.

Interactive procedure display environment 306 creates a visual representation of the procedure from internal procedure representation 305, displays it to procedure designer(s) 100, and provides the procedure designer(s) with interactive viewing and editing capabilities. In one embodiment, the interactive procedure display environment includes a graphical user interface running on a desktop computer that visually represents elements of the procedure workflow via graphical elements such as boxes and arrows, that provides a mechanism for displaying the documentation elements associated with the procedure and its constituent workflow elements (drawing content from documentation element repository 103 as needed), and that provides a mechanism for invoking the various interfaces, 300 through 304, to modify or extend the displayed procedure.

Interactive procedure display environment 306 also provides functionality to display complexity analysis results 104 provided to procedure builder 101 by complexity analyzer component 108. The complexity analysis results are consumed by two components.

First is complexity analysis summarizer 307, which produces procedure-wide summaries of the complexity analysis results, for example, by compiling the results into a set of summary metrics describing the overall time and skill level required to execute the procedure.

Complexity analysis results 104 are also consumed by complexity analysis to workflow mapper 308, which identifies correspondences between complexity analysis results and individual workflow elements or collections thereof and establishes the mapping between those results and the corresponding elements. For example, the complexity analysis results may contain step-by-step complexity scores, indicating the complexity contribution of each step in the procedure. The complexity analysis to workflow mapper establishes the mapping of those step-by-step results to the corresponding workflow elements in the procedure builder's internal representation.

Workflow complexity annotation generator 309 converts those correspondences to annotations that can be made to the procedure displayed by interactive procedure display environment 306, for example, complexity-coded color overlays to display on top of a visual representation of the procedure. The results of complexity analysis summarizer 307 and workflow complexity annotation generator 309 provide the input used by interactive procedure display environment 306 to display complexity analysis results 104, providing feedback to procedure designer(s) 100 as to the complexity of the IT operations procedure in question.

Finally, procedure builder 101 includes automated procedure optimizer 310, which uses automated techniques to alter the procedure being built in order to reduce its complexity. This component directly manipulates internal procedure representation 305 based on the processed complexity analysis results as output from complexity analysis summarizer 307 and complexity analysis to workflow mapper 308. The automated procedure optimizer may use a variety of methods to achieve the desired optimization. In one embodiment, it may simplify convoluted control flow by collapsing redundant decision paths. In another embodiment, it may optimize utilization of a highly-skilled role by reassigning tasks based on their complexity, e.g., by moving low-complexity tasks to low-skilled roles.

Figure 4:
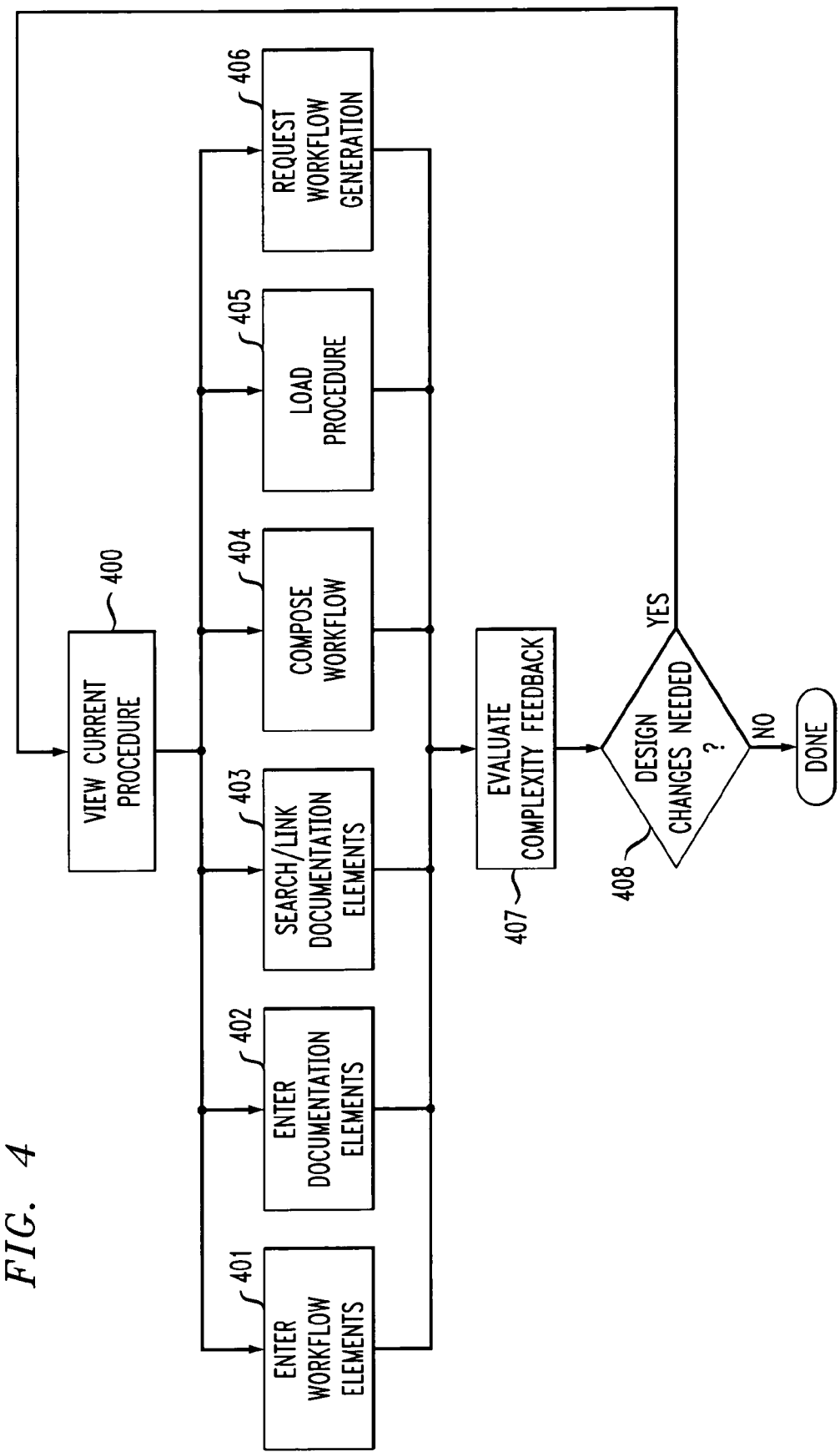
FIG. 4 is a flow diagram illustrating a procedure builder methodology, according to an embodiment of the invention.

FIG. 4 depicts a process underlying the procedure builder component in FIG. 3. The first step 400 occurs when procedure designer(s) 100 views the current procedure being built/authored. Next, one or more of the tasks 401 through 406 are performed: entering workflow elements to create new elements for the procedure or modify existing ones (step 401); entering documentation elements to create new documentation elements or modify existing ones (step 402); searching documentation element repository 103 to identify appropriate documentation and linking it to the procedure or its elements (step 403); composing workflow elements together (step 404); loading pre-existing procedures (step 405); or requesting workflow generation (step 406), in which case internal procedure representation 305 is exported to workflow extractor 106.

After performing one or more of these tasks, procedure designer(s) 100 receives complexity feedback using the mechanisms described above, and in step 407, evaluates that feedback. In step 408, the procedure designer(s) determines whether additional design changes are warranted, for example, to reduce overall complexity or eliminate a point of particularly high complexity. If no such changes are needed, the method terminates, otherwise, steps 400 through 408 are repeated.

Figure 5:
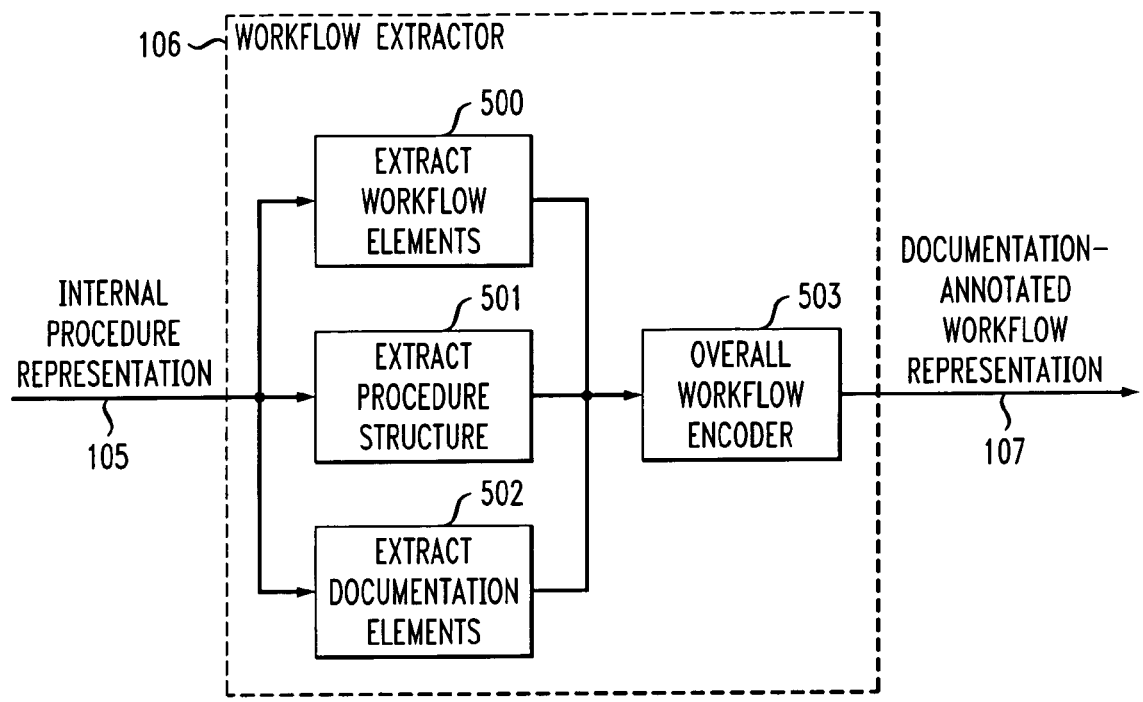
FIG. 5 is a block diagram illustrating a workflow extractor component, according to an embodiment of the invention.

Referring now to FIG. 5, a block diagram illustrates a workflow extractor component, according to an embodiment of the invention. More particularly, FIG. 5 depicts an example of workflow extractor component 106.

Workflow extractor 106 consumes internal process representation 105 from procedure builder 101. In parallel, the workflow extractor extracts the workflow elements from that representation (block 500), extracts the workflow structure (how the workflow elements are composed, e.g. via control flow) from that representation (block 501), and extracts the documentation elements from that representation (block 502). These extracted elements are then encoded into a structured representation of the overall workflow (block 503), producing documentation-annotated workflow representation 107. In one embodiment, the documentation-annotated workflow representation takes the form of an XML document patterned loosely around the WS-BPEL workflow representation but extended to support the inclusion of documentation elements and associations.

Figure 6:
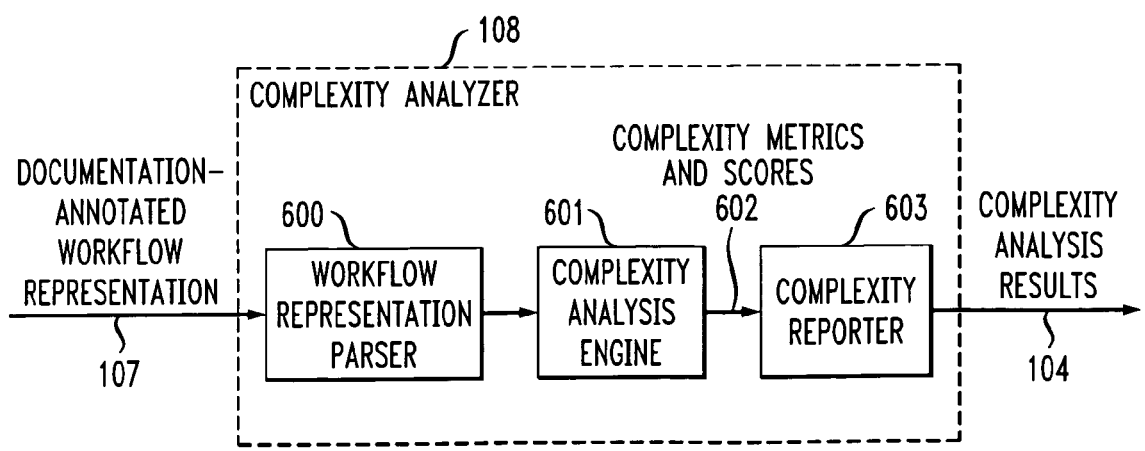
FIG. 6 is a block diagram illustrating a complexity analyzer component, according to an embodiment of the invention.

Referring now to FIG. 6, a block diagram illustrates complexity analyzer component, according to an embodiment of the invention. More particularly, FIG. 6 depicts an example of complexity analyzer component 108.

Complexity analyzer 108 includes three sub-components. Workflow representation parser 600 parses documentation-annotated workflow representation 107 to extract the workflow structure and elements, and to discard the documentation elements not used in the complexity analysis. Next, complexity analysis engine 601 performs the complexity analysis, producing complexity metrics and scores 602. These metrics and scores are consumed by complexity reporter 603, which post-processes the metrics and scores for a variety of purposes, including, but not limited to, producing summary metrics, predicting complexity impact in terms of measures like estimated time and skill requirements, and identifying points of high complexity. The resulting complexity analysis results 104 are output from complexity analyzer 108.

In one embodiment, the complexity analyzer component employs the techniques described in the above-referenced U.S. patent application identified by Ser. No. 11/205,972 and issued as U.S. Pat. No. 7,177,774 on Feb. 13, 2007. That is, workflow representation parser 600 employs the techniques of the configuration-related data collector described in Ser. No. 11/205,972, complexity analysis engine 601 employs the techniques of the complexity analyzer described in Ser. No. 11/205,972, and complexity reporter 603 employs the techniques of the reporter component described in Ser. No. 11/205,972. However, it is to be understood that the present invention is not limited to the complexity analysis implementations of Ser. No. 11/205,972, and that other complexity analysis techniques may be employed.

Figure 7:
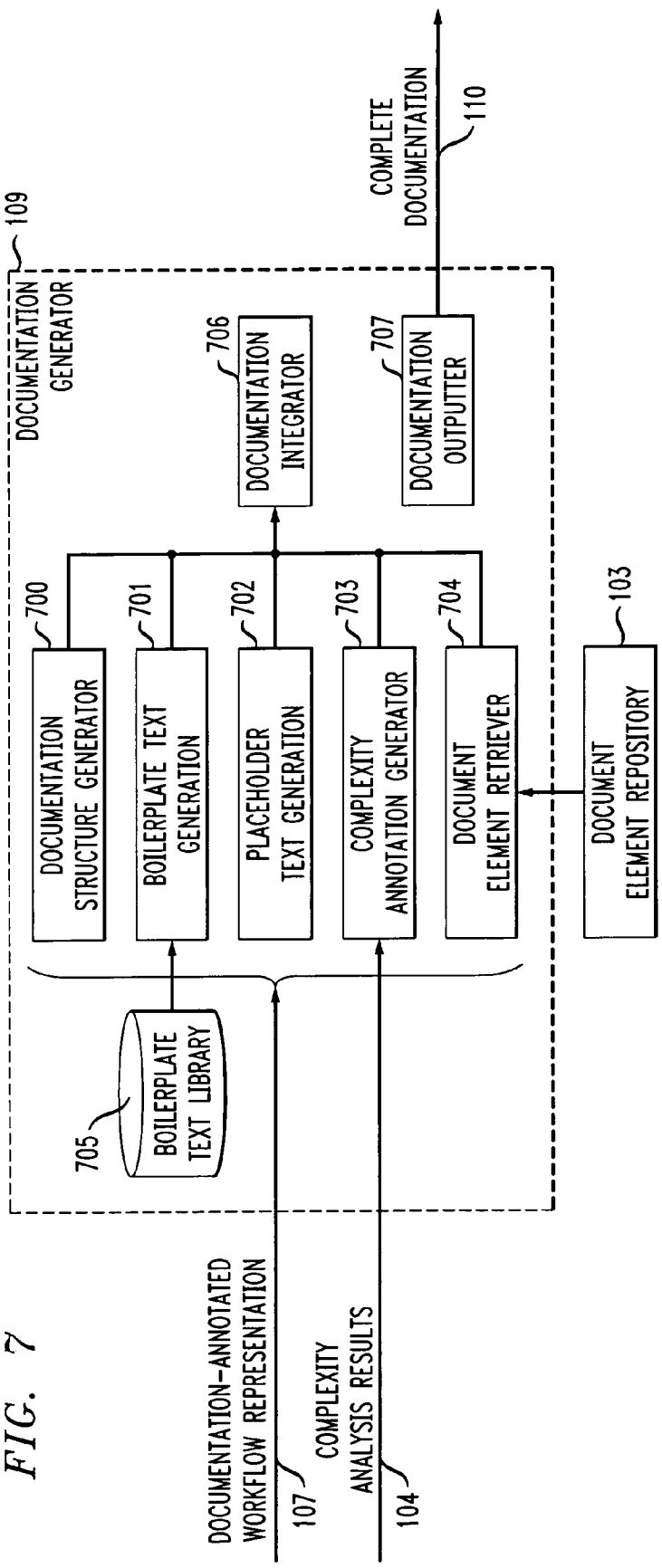
FIG. 7 is a block diagram illustrating a documentation generator component, according to an embodiment of the invention.

Referring now to FIG. 7, a block diagram illustrates documentation generator component, according to an embodiment of the invention. More particularly, FIG. 7 depicts an example of documentation generator component 109.

As shown, documentation-annotated workflow representation 107 is the primary input to documentation generator 109, and is distributed to components 700 through 704, each of which generates a portion of the final output documentation based on the documentation-annotated workflow representation input.

Documentation structure generator 700 creates the overall structure of the documentation, creating such structuring elements as chapters, sections, subsections, bulleted lists, cross-references, tables of contents, indices, and navigation cues based on the structure of the procedure. As an illustrative example, a procedure with one task followed by a decision point with an additional task on each of the two decision branches might result in a structure of four sections, the first documenting the first task, the second documenting the decision criteria and cross-referencing the third and fourth sections, each of which documents one of the two remaining tasks.

Boilerplate text generator 701 generates the text elements needed to document the structure produced by documentation structure generator 700, such as text indicating cross-references, section headings, and the like. This component draws on and assembles pre-existing text from boilerplate text library 705.

Placeholder text generation component 702 identifies places where the procedure designer must supply additional documentation text, for example, if a workflow element has no associated documentation element, or if the procedure does not have associated with it a documentation element providing the overall introduction to the procedure's functionality. The placeholder text generation component generates marker text (e.g., a special flag string) for such situations so that the procedure designer can determine where additional documentation text is needed.

Complexity annotation generator 703 draws on complexity analysis results 104 to produce documentation text conveying the results of the complexity analysis. In one embodiment, this includes a summary report on the overall procedure's complexity, as well as annotations for each documented element (such as a task) describing its computed complexity. Other embodiments are possible as well, for example, taking the form of graphs plotting the complexity across the procedure steps, or tables estimating skill requirements for different roles documented in the procedure.

Document element retriever 704 identifies points in documentation-annotated workflow representation 107 where associations are identified between workflow elements and pre-existing documentation elements in documentation element repository 103, and extracts those elements for assembly into the final documentation.

Documentation integrator 706 takes the output of components 700 through 704 and assembles the various documentation components so generated into an overall integrated document representation.

Documentation outputter 707 converts this representation into one or more of several standard formats, such as, but not limited to, HTML, PDF, and/or XML, and outputs the result as complete documentation 110.

Figure 8:
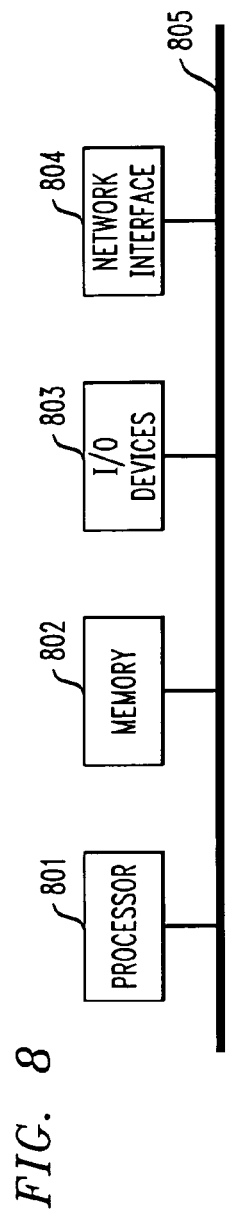
FIG. 8 is a block diagram illustrating a computer system for implementing a procedure authoring and configuration complexity evaluation system, according to an embodiment of the invention.

Referring finally to FIG. 8, a block diagram illustrates a computer system for implementing a procedure authoring and configuration complexity evaluation system, according to an embodiment of the invention. That is, FIG. 8 depicts an illustrative implementation of a computer system in accordance with which one or more components/methodologies of a procedure authoring and configuration complexity evaluation system (e.g., components/methodologies described in the context of FIGS. 1 through 7) may be implemented. For instance, the computer system in FIG. 8 may implement the components associated with the procedure authoring and configuration complexity evaluation system of FIG. 1 and implement the methodologies described herein. Also, the computer system of FIG. 8 may represent implementations of computers used by one or more individuals associated with the environment of FIG. 1, e.g., procedure designer(s).

It is to be understood that such individual components/methodologies may be implemented on one such computer system, or on more than one such computer system. In the case of an implementation in a distributed computing system, the individual computer systems and/or devices may be connected via a suitable network, e.g., the Internet or World Wide Web. However, the system may be realized via private or local networks. The invention is not limited to any particular network.

As shown, the computer system may be implemented in accordance with a processor 801, a memory 802, I/O devices 803, and a network interface 804, coupled via a computer bus 805 or alternate connection arrangement.

It is to be appreciated that the term "processor" as used herein is intended to include any processing device, such as, for example, one that includes a CPU (central processing unit) and/or other processing circuitry. It is also to be understood that the term "processor" may refer to more than one processing device and that various elements associated with a processing device may be shared by other processing devices.

The term "memory" as used herein is intended to include memory associated with a processor or CPU, such as, for example, random access memory (RAM), read only memory (ROM), a fixed memory device (e.g., hard drive), a removable memory device (e.g., diskette), flash memory, etc.

In addition, the phrase "input/output devices" or "I/O devices" as used herein is intended to include, for example, one or more input devices (e.g., keyboard, mouse, etc.) for entering data to the processing unit, and/or one or more output devices (e.g., speaker, display, etc.) for presenting results associated with the processing unit.

Still further, the phrase "network interface" as used herein is intended to include, for example, one or more transceivers to permit the computer system to communicate with another computer system via an appropriate communications protocol.

Accordingly, software components including instructions or code for performing the methodologies described herein may be stored in one or more of the associated memory devices (e.g., read only memory, fixed or removable memory) and, when ready to be utilized, loaded in part or in whole (e.g., into random access memory) and executed by a CPU.

In any case, it is to be appreciated that the techniques of the invention, described herein and shown in the appended figures, may be implemented in various forms of hardware, software, or combinations thereof, e.g., one or more operatively programmed general purpose digital computers with associated memory, implementation-specific integrated circuit(s), functional circuitry, etc. Given the techniques of the invention provided herein, one of ordinary skill in the art will be able to contemplate other implementations of the techniques of the invention.

Accordingly, as illustratively explained above, embodiments of the invention provide techniques for integrating design, authoring, documentation, and complexity analysis of operations procedures for IT systems. By way of example, a technique for integrating design, authoring, documentation, and complexity analysis of operations procedures for IT systems comprises the following steps/operations. An IT operations procedure is authored using an interactive environment that allows specification of procedure elements and associated documentation elements. The procedure is then encoded in a structured representation suitable for complexity analysis. This structured representation is analyzed to produce complexity scores and metrics for the overall procedure and/or for individual procedure elements. These complexity scores and metrics are transferred back to the authoring environment where they are used to provide dynamic complexity feedback to the procedure designer, enabling the designer to optimize the procedure to minimize complexity and/or make informed complexity-related design decisions, and further enabling automated optimization of the procedure within the authoring environment. Finally, the same documentation-annotated workflow representation used to feed the complexity analyzer is processed to assemble its linked or embedded documentation elements into unified documentation describing the entire procedure.

Thus, principles of the invention provide many advantageous systems and methods, for example: a system for integrating design, documentation authoring, and complexity analysis for IT operations procedures that provides dynamic complexity feedback to procedure designers; a system that generates user-ready documentation for the completed procedure; a system that provides dynamic feedback on the flexibility of the procedure being designed; a system that includes a procedure builder, a workflow extractor, and a complexity analyzer; a system that also includes a documentation generator; a method for iterative authoring of IT operations procedures using complexity feedback to guide design decisions; a method for integrating procedure authoring, complexity analysis, and documentation generation; a method for extracting a documentation-annotated workflow representation from an interactive procedure builder; a method for generating formatted documentation from a documentation-annotated workflow representation; a method for incorporating the results of a complexity analysis into the interactive display of an interactive procedure builder, for example, as complexity annotations on procedure components, or as a complexity gauge displaying the overall procedure complexity; a method for dynamically updating the display of complexity information as a procedure is constructed in the procedure builder; a method for automatically optimizing IT operations procedures towards reduced complexity based on the incorporation of complexity feedback into a procedure builder that incorporates an automated procedure optimizer.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A computer-implemented method for authoring a procedure associated with a computing system operation based on a complexity analysis associated with the operation and the computing system implementing the operation, comprising executing the following steps via a computer:

generating a procedure associated with the computing system operation, wherein the generated procedure represents a new procedure or an edited existing procedure;

extracting from the generated procedure a workflow representation of the generated procedure, the workflow representation being an annotated document documenting the overall workflow of the generated procedure and comprising one or more workflow elements of the generated procedure and one or more documentation elements of the generated procedure; and analyzing the workflow representation of the generated procedure to produce complexity analysis results, wherein at least a portion of the complexity analysis results are fed back to a procedure author for use in selectively altering the generated procedure;

wherein the procedure generating step further comprises searching a documentation element repository to identify appropriate documentation and linking the documentation to the procedure or one or more elements of the procedure.

2. A computer-implemented method for authoring a procedure associated with a computing system operation based on a complexity analysis associated with the operation and the computing system implementing the operation, comprising executing the following steps via a computer:

generating a procedure associated with the computing system operation, wherein the generated procedure represents a new procedure or an edited existing procedure;

extracting from the generated procedure a workflow representation of the generated procedure, the workflow representation being an annotated document documenting the overall workflow of the generated procedure and comprising one or more workflow elements of the generated procedure and one or more documentation elements of the generated procedure; and analyzing the workflow representation of the generated procedure to produce complexity analysis results, wherein at least a portion of the complexity analysis results are fed back to a procedure author for use in selectively altering the generated procedure;

wherein the procedure generating step further comprises exporting an internal procedure representation for use by the extracting step.

3. A computer-implemented method for authoring a procedure associated with a computing system operation based on a complexity analysis associated with the operation and the computing system implementing the operation, comprising executing the following steps via a computer:

generating a procedure associated with the computing system operation, wherein the generated procedure represents a new procedure or an edited existing procedure;

extracting from the generated procedure a workflow representation of the generated procedure, the workflow representation being an annotated document documenting the overall workflow of the generated procedure and comprising one or more workflow elements of the generated procedure and one or more documentation elements of the generated procedure; and analyzing the workflow representation of the generated procedure to produce complexity analysis results, wherein at least a portion of the complexity analysis results are fed back to a procedure author for use in selectively altering the generated procedure;

wherein the extracting step further comprises obtaining an internal procedure representation generated by the procedure generation step, and extracting one or more workflow elements from the internal procedure representation.

4. The method of claim 3, wherein the extracting step further comprises extracting a workflow structure from the internal procedure representation.

5. The method of claim 4, wherein the extracting step further comprises extracting one or more documentation elements from the internal procedure representation.

6. A computer-implemented method for authoring a procedure associated with a computing system operation based on a complexity analysis associated with the operation and the computing system implementing the operation, comprising executing the following steps via a computer:

generating a procedure associated with the computing system operation, wherein the generated procedure represents a new procedure or an edited existing procedure;

extracting from the generated procedure a structured representation of the generated procedure; and analyzing the structured representation of the generated procedure to produce complexity analysis results, wherein at least a portion of the complexity analysis results are fed back to a procedure author for use in selectively altering the generated procedure;

wherein the extracting step further comprises:
  obtaining an internal procedure representation generated by the procedure generation step;
  extracting one or more workflow elements from the internal procedure representation;
  extracting a workflow structure from the internal procedure representation;
  extracting one or more documentation elements from the internal procedure representation; and
  encoding extracted information into a structured representation of an overall workflow such that a documentation-annotated workflow representation is produced.

7. A computer-implemented method for authoring a procedure associated with a computing system operation based on a complexity analysis associated with the operation and the computing system implementing the operation, comprising executing the following steps via a computer:

generating a procedure associated with the computing system operation, wherein the generated procedure represents a new procedure or an edited existing procedure;

extracting from the generated procedure a structured representation of the generated procedure;

analyzing the structured representation of the generated procedure to produce complexity analysis results, wherein at least a portion of the complexity analysis results are fed back to a procedure author for use in selectively altering the generated procedure; and generating documentation relating to the generated procedure from the structured representation of the generated procedure;

wherein the documentation generating step further comprises relating to the generated procedure from the structured representation of the generated procedure, and assembling one or more linked or embedded documentation elements into a unified documentation describing the generated procedure.

8. A computer-implemented method for authoring a procedure associated with a computing system operation based on a complexity analysis associated with the operation and the computing system implementing the operation, comprising executing the following steps via a computer:

generating a procedure associated with the computing system operation, wherein the generated procedure represents a new procedure or an edited existing procedure;

extracting from the generated procedure a structured representation of the generated procedure;

analyzing the structured representation of the generated procedure to produce complexity analysis results, wherein at least a portion of the complexity analysis results are fed back to a procedure author for use in selectively altering the generated procedure; and generating documentation relating to the generated procedure from the structured representation of the generated procedure;

wherein the documentation generating step further comprises relating to the generated procedure from the structured representation of the generated procedure, and annotating the documentation with complexity-based meta-information.

* * * * *